United States Patent
Tsunoda

(10) Patent No.: US 8,957,365 B2
(45) Date of Patent: Feb. 17, 2015

(54) LIGHT RECEPTION CIRCUIT AND LIGHT RECEPTION DEVICE

(71) Applicant: Fujitsu Limited, Kawasaki-shi, Kanagawa (JP)

(72) Inventor: Yukito Tsunoda, Isehara (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 13/959,091

(22) Filed: Aug. 5, 2013

(65) Prior Publication Data

US 2014/0097331 A1    Apr. 10, 2014

(30) Foreign Application Priority Data

Oct. 9, 2012  (JP) ................. 2012-224251

(51) Int. Cl.
*H03F 3/08*    (2006.01)

(52) U.S. Cl.
CPC ........................ *H03F 3/08* (2013.01)
USPC ............... 250/214 A; 250/214 LA; 330/308

(58) Field of Classification Search
CPC .............. H03F 3/04; H03F 3/08; H03L 5/00; H01J 40/14
USPC ............. 250/214 R, 214 A, 214 LA, 214 AG, 250/214 C; 398/202, 209; 330/59, 86, 110, 330/308; 327/307, 333, 363, 514, 563
See application file for complete search history.

(56) References Cited

U.S. PATENT DOCUMENTS

| 7,158,729 B2 * | 1/2007 | Yokomizo ..................... 398/202 |
| 8,445,832 B2 * | 5/2013 | Takemoto et al. ........ 250/214 A |
| 2002/0109075 A1 | 8/2002 | Ono |
| 2005/0040892 A1 | 2/2005 | Seetharaman et al. |
| 2011/0293293 A1 | 12/2011 | Sugimoto |

FOREIGN PATENT DOCUMENTS

| JP | 6-224652 | 8/1994 |
| JP | 2001-168374 | 6/2001 |
| JP | 2002-232271 | 8/2002 |
| JP | 2007-503170 | 2/2007 |
| JP | 2008-180522 | 8/2008 |
| JP | 2011-250126 | 12/2011 |

* cited by examiner

*Primary Examiner* — Kevin Pyo
(74) *Attorney, Agent, or Firm* — Staas & Halsey LLP

(57) ABSTRACT

A light reception circuit includes a direct current (DC) level shift circuit that shifts a DC voltage level of a first signal or a second signal and outputs a third signal or a fourth signal, or outputs both of the third signal and the fourth signal so that a DC voltage level of the first signal output from a cathode of a photodiode that generates a signal by photo conversion and a DC voltage level of the second signal output from an anode of the photodiode agree, and a differential amplifier that amplifies a difference between the third signal and the second signal, between the first signal and the fourth signal, or the third signal and the fourth signal, based on the third signal, the forth signal output from the DC level shift circuit, impedance of the DC level shift circuit being lower than input impedance of the differential amplifier.

10 Claims, 8 Drawing Sheets

LIGHT RECEPTION CIRCUIT AND LIGHT RECEPTION DEVICE

CROSS-REFERENCE TO RELATED APPLICATION

This application is based upon and claims the benefit of priority of the prior Japanese Patent Application No. 2012-224251, filed on Oct. 9, 2012, the entire contents of which are incorporated herein by reference.

FIELD

The embodiment discussed herein is related to a light reception circuit and a light reception device.

BACKGROUND

For example, Japanese Laid-open Patent Publication No. 6-224652 discusses a light reception circuit in which bias elements are coupled to both ends of a photodiode, an anode and a cathode of the photodiode are coupled to input terminals of a differential amplification unit via capacitors, and resistors are coupled between a positive input terminal and an inverting output terminal of a differential amplifier and between a negative input terminal and a positive output terminal of the differential amplifier.

For example, Japanese Laid-open Patent Publication No. 2008-180522 discusses a photoelectric encoder in which a direct current (DC) offset of a light reception signal is reduced based on the fluctuating light reception signal itself by negatively feeding back a DC output of a differential amplifier to an input side of diodes making up a logarithmic compression unit.

For example, Japanese Laid-open Patent Publication No. 2002-232271 discusses a DC offset cancel circuit that cancels a DC offset voltage caused in a differential output signal of a differential amplification circuit by negatively feeding back the differential output signal of the differential amplification circuit to an input side of the differential amplification circuit via a low-pass filter.

For example, Japanese Laid-open Patent Publication No. 2001-168374 discusses a photoelectric conversion circuit in which resistors are coupled to a cathode and an anode of a photodiode respectively, another resistor is coupled in parallel to the photodiode, the cathode and the anode of the photodiode are coupled to two input terminals of a level shift circuit respectively, and output signals are obtained from two output terminals of the level shift circuit. In the photoelectric conversion circuit, a source follower circuit is used as the level shift circuit.

In order to achieve high speed processing in an arrangement in which an anode and a cathode of a photodiode and each input terminal of a differential amplifier are coupled by capacitive coupling via a capacitor, an input impedance of the differential amplifier is desirably lowered. However, when the input impedance of the differential amplifier is lowered, low-frequency cutoff may be caused by the capacitor and fluctuations may occur in a reception waveform of a signal formed of "0" and "1", which are continuous values, and as a result, the waveform may deteriorate.

SUMMARY

According to an aspect of the invention, a light reception circuit includes a direct current (DC) level shift circuit that shifts a DC voltage level of a first signal or a second signal and outputs a third signal or a fourth signal, or outputs both of the third signal and the fourth signal so that a DC voltage level of the first signal output from a cathode of a photodiode that generates a signal by photo conversion and a DC voltage level of the second signal output from an anode of the photodiode agree, and a differential amplifier that amplifies a difference between the third signal and the second signal, between the first signal and the fourth signal, or the third signal and the fourth signal, based on the third signal, the forth signal output from the DC level shift circuit, impedance of the DC level shift circuit being lower than input impedance of the differential amplifier.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

A preferred embodiment of a light reception circuit and a light reception device is described in detail below with reference to the accompanying drawings. In the description of each example below, the same references are given to similar constituents and repeated explanation is omitted.

Example of Light Reception Circuit and Light Reception Device

Figure 1:
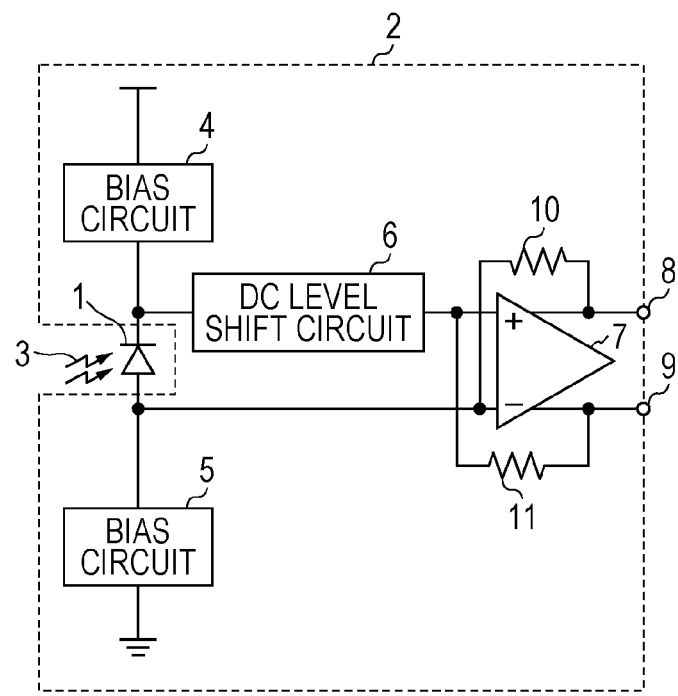
FIG. 1 illustrates an example of a light reception circuit and a light reception device according to an embodiment.

FIG. 1 illustrates an example of a light reception circuit and a light reception device according to an embodiment. As illustrated in FIG. 1, the light reception device includes a photodiode 1 and a light reception circuit 2. The photodiode 1 receives an optical signal 3 and generates an electric signal by photoelectric conversion. The impedance between an anode and a cathode of the photodiode 1 may be high. Ideally, the impedance between the anode and the cathode of the photodiode 1 is infinite.

The light reception circuit 2 amplifies a difference between electric signals that are respectively output from the anode and the cathode of the photodiode 1. The light reception circuit 2 includes bias circuits 4 and 5, a direct current (DC) level shift circuit 6, and a differential amplifier 7. The impedance of the DC level shift circuit 6 is lower than the input impedance of the differential amplifier 7. Ideally, the impedance of the DC level shift circuit 6 is zero.

The bias circuit 4 on the cathode side is coupled between the cathode of the photodiode 1 and a positive power supply line. The bias circuit 5 on the anode side is coupled between the anode of the photodiode 1 and a ground line. The bias circuits 4 and 5 apply an opposite directional bias between the anode and the cathode of the photodiode 1. For example, the bias circuits 4 and 5 may be a resistor, a current source, or an inductor. A first electric signal is output from the cathode of the photodiode 1. A second electric signal is output from the anode of the photodiode 1.

The DC level shift circuit 6 is coupled to the cathode of the photodiode 1. The DC level shift circuit 6 shifts the DC voltage level of the first electric signal and outputs a third electric signal so that the DC voltage level of the first electric signal and the DC voltage level of the second electric signal may agree. For example, the DC level shift circuit 6 may be a diode with impedance that is low in the ON state.

A positive input terminal of the differential amplifier 7 is coupled to the DC level shift circuit 6. The third electric signal is input to the positive input terminal of the differential amplifier 7. A negative input terminal of the differential amplifier 7 is coupled to the anode of the photodiode 1. The second electric signal is input to the negative input terminal of the differential amplifier 7. The differential amplifier 7 amplifies a difference between the third electric signal and the second electric signal.

A positive output terminal of the differential amplifier 7 is coupled to an output terminal 8 of the light reception circuit 2. An inverting output terminal of the differential amplifier 7 is coupled to another output terminal 9 of the light reception circuit 2. In the example illustrated in FIG. 1, a resistor 10 is coupled between the positive output terminal of the differential amplifier 7 and the negative input terminal of the differential amplifier 7. Also, another resistor 11 is coupled between the inverting output terminal of the differential amplifier 7 and the positive input terminal of the differential amplifier 7. Together with the resistors 10 and 11, the differential amplifier 7 may operate as a transimpedance amplifier that converts a current signal into a voltage signal.

The bias circuit 4 on the cathode side may be coupled to the ground line and the bias circuit 5 on the anode side may be coupled to a negative power supply line.

Another Example of Light Reception Circuit and Light Reception Device

Figure 2:
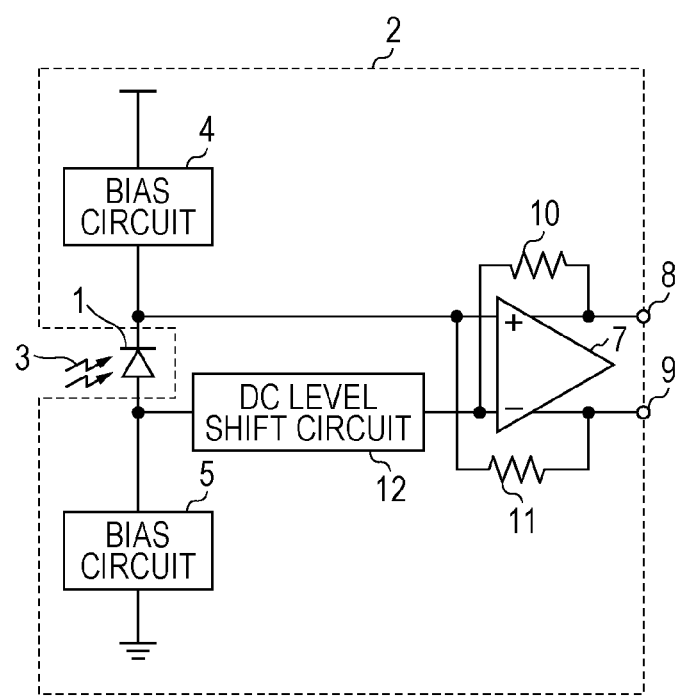
FIG. 2 illustrates another example #1 of the light reception circuit and the light reception device according to the embodiment.

FIG. 2 illustrates another example #1 of the light reception circuit and the light reception device according to the embodiment. In the light reception circuit 2 illustrated in FIG. 2, a DC level shift circuit 12 is coupled to the anode of the photodiode 1. The impedance of the DC level shift circuit 12 is lower than the input impedance of the differential amplifier 7. Ideally, the impedance of the DC level shift circuit 12 is zero.

The DC level shift circuit 12 shifts the DC voltage level of the second electric signal and outputs a fourth electric signal so that the DC voltage level of the first electric signal and the DC voltage level of the second electric signal may agree. For example, the DC level shift circuit 12 may be a diode with impedance that is low in the ON state.

The positive input terminal of the differential amplifier 7 is coupled to the cathode of the photodiode 1. The first electric signal is input to the positive input terminal of the differential amplifier 7. The negative input terminal of the differential amplifier 7 is coupled to the DC level shift circuit 12. The fourth electric signal is input to the negative input terminal of the differential amplifier 7. The differential amplifier 7 amplifies a difference between the first electric signal and the fourth electric signal.

The other constituents of the light reception circuit and the light reception device illustrated in FIG. 2 are similar to the constituents of the light reception circuit and the light reception device illustrated in FIG. 1. Thus, repeated explanation is omitted.

Another Example of Light Reception Circuit and Light Reception Device

Figure 3:
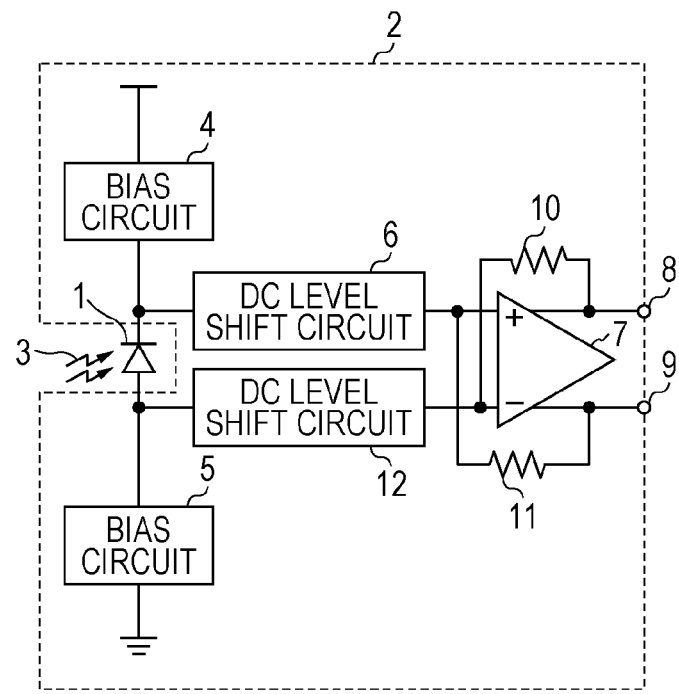
FIG. 3 illustrates another example #2 of the light reception circuit and the light reception device according to the embodiment.

FIG. 3 illustrates another example #2 of the light reception circuit and the light reception device according to the embodiment. In the light reception circuit 2 illustrated in FIG. 3, the DC level shift circuit 6 is coupled to the cathode of the photodiode 1 and the DC level shift circuit 12 is coupled to the anode of the photodiode 1. The impedance of the DC level shift circuit 6 and the impedance of the DC level shift circuit 12 are lower than the input impedance of the differential amplifier 7.

The DC level shift circuit 6 is explained in the example illustrated in FIG. 1. Also, the DC level shift circuit 12 is explained in the example illustrated in FIG. 2. Thus, repeated explanation is omitted.

The positive input terminal of the differential amplifier 7 is coupled to the DC level shift circuit 6. The third electric signal is input to the positive input terminal of the differential amplifier 7. The negative input terminal of the differential amplifier 7 is coupled to the DC level shift circuit 12. The fourth electric signal is input to the negative input terminal of the differential amplifier 7. The differential amplifier 7 amplifies a difference between the third electric signal and the fourth electric signal.

The other constituents of the light reception circuit and the light reception device illustrated in FIG. 3 are similar to the constituents of the light reception circuit and the light reception device illustrated in FIG. 1. Thus, repeated explanation is omitted.

According to the light reception circuit and the light device illustrated in FIG. 1, 2, or 3, the anode and the cathode of the photodiode 1 and each input terminal of the differential amplifier 7 are coupled without using capacitive coupling via a capacitor. Accordingly, when high speed processing is pursued while lowering the input impedance of the differential amplifier 7, no low-frequency cutoff is caused by the capacitive coupling. Thus, deterioration in the waveform of a signal output from the differential amplifier 7, that is, a reception signal may be suppressed.

Another Example of Light Reception Circuit and Light Reception Device

Figure 4:
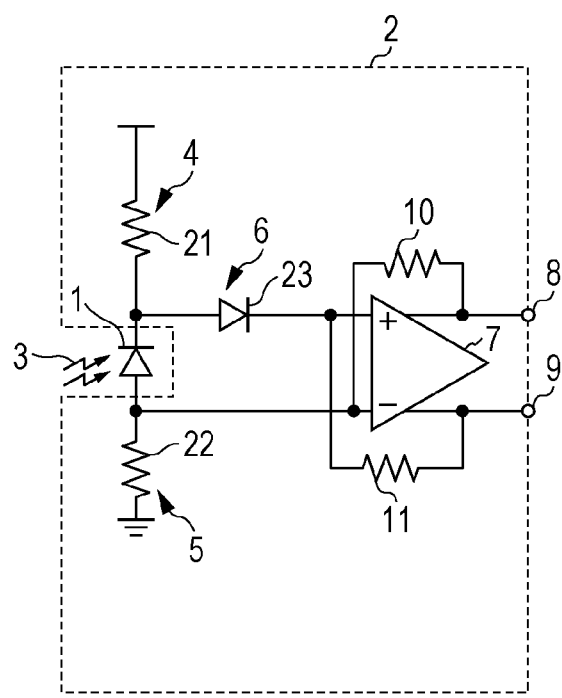
FIG. 4 illustrates another example #3 of the light reception circuit and the light reception device according to the embodiment.

FIG. 4 illustrates another example #3 of the light reception circuit and the light reception device according to the embodiment. In the light reception circuit and the light reception device illustrated in FIG. 4, compared with the light reception circuit and the light reception device illustrated in FIG. 1, a resistor 21 is used for the bias circuit 4 on the cathode side, a resistor 22 is used for the bias circuit 5 on the anode side, and a diode 23 is used for the DC level shift circuit 6. With regard to constituents similar to the constituents of the light reception circuit and the light reception device illustrated in FIG. 1, repeated explanation is omitted.

The resistor 21 used for the bias circuit 4 on the cathode side is coupled between the cathode of the photodiode 1 and the positive power supply line. The resistor 22 used for the bias circuit 5 on the anode side is coupled between the anode of the photodiode 1 and the ground line. The resistor 21 on the cathode side may be coupled to the ground line and the resistor 22 on the anode side may be coupled to the negative power supply line.

The anode of the diode 23 used for the DC level shift circuit 6 is coupled to the cathode of the photodiode 1. The cathode of the diode 23 is coupled to the positive input terminal of the differential amplifier 7. When the diode 23 enters the ON state, the voltage falls. Thus, the DC voltage level of an electric signal output from the anode of the photodiode 1 may be lowered by the diode 23 entering the ON state.

Another Example of Light Reception Circuit and Light Reception Device

Figure 5:
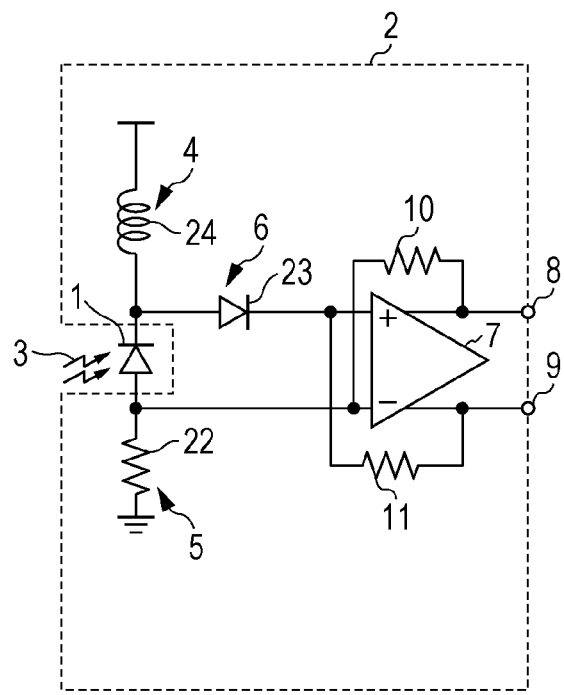
FIG. 5 illustrates another example #4 of the light reception circuit and the light reception device according to the embodiment.

FIG. 5 illustrates another example #4 of the light reception circuit and the light reception device according to the embodiment. In the light reception circuit and the light reception device illustrated in FIG. 5, compared with the light reception circuit and the light reception device illustrated in FIG. 1, an inductor 24 is used for the bias circuit 4 on the cathode side, the resistor 22 is used for the bias circuit 5 on the anode side, and the diode 23 is used for the DC level shift circuit 6. With regard to constituents similar to the constituents of the light reception circuit and the light reception device illustrated in FIG. 1, repeated explanation is omitted.

The inductor 24 used for the bias circuit 4 on the cathode side is coupled between the cathode of the photodiode 1 and the positive power supply line. The resistor 22 used for the bias circuit 5 on the anode side and the diode 23 used for the DC level shift circuit 6 are explained in the example illustrated in FIG. 4. Thus, repeated explanation is omitted. The inductor 24 on the cathode side may be coupled to the ground line and the resistor 22 on the anode side may be coupled to the negative power supply line.

Another Example of Light Reception Circuit and Light Reception Device

Figure 6:
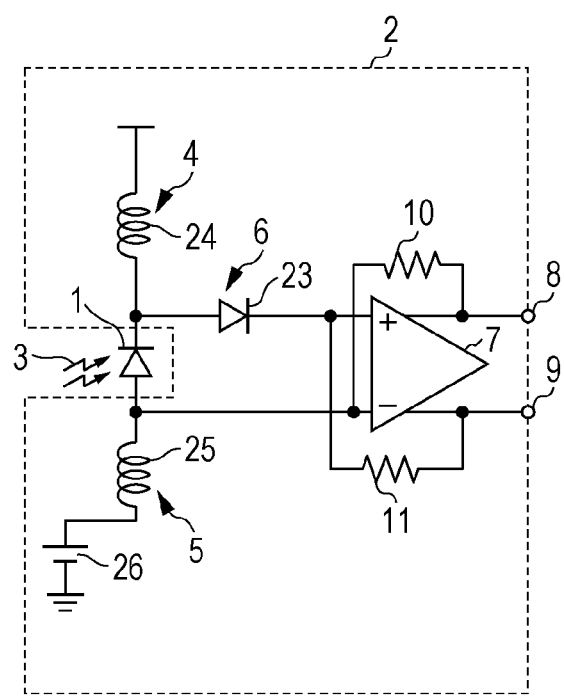
FIG. 6 illustrates another example #5 of the light reception circuit and the light reception device according to the embodiment.

FIG. 6 illustrates another example #5 of the light reception circuit and the light reception device according to the embodiment. In the light reception circuit and the light reception device illustrated in FIG. 6, compared with the light reception circuit and the light reception device illustrated in FIG. 1, the inductor 24 is used for the bias circuit 4 on the cathode side, an inductor 25 is used for the bias circuit 5 on the anode side, and the diode 23 is used for the DC level shift circuit 6. With regard to constituents similar to the constituents of the light reception circuit and the light reception device illustrated in FIG. 1, repeated explanation is omitted.

The inductor 24 used for the bias circuit 4 on the cathode side is coupled between the cathode of the photodiode 1 and the positive power supply line. The inductor 25 used for the bias circuit 5 on the anode side is coupled between the anode of the photodiode 1 and a DC voltage source 26. A negative electrode of the DC voltage source 26 is coupled to the ground line. The DC voltage source 26 supplies a bias of a direct current between the anode and the cathode of the photodiode 1.

The diode 23 used for the DC level shift circuit 6 is explained in the example illustrated in FIG. 4. Thus, repeated explanation is omitted. The inductor 24 on the cathode side may be coupled to the ground line and the inductor 25 on the anode side may be coupled to the negative power supply line.

According to the light reception circuit and the light reception device illustrated in FIG. 4, 5, or 6, capacitive coupling via a capacitor is not used for coupling the anode and the cathode of the photodiode 1 to each input terminal of the differential amplifier 7. Thus, similar to the example illustrated in FIG. 1, 2, or 3, deterioration in the waveform of a reception signal may be suppressed.

By the way, Japanese Laid-open Patent Publication No. 2001-168374 described above discloses that a resistor is coupled in parallel to a photodiode and a source follower circuit is used as a level shift circuit. However, the input impedance of the source follower circuit, which is high, may hinder high speed processing. In order to lower the input impedance, each impedance of resistors coupled to the cathode and the anode of the photodiode and the resistor coupled in parallel to the photodiode is desirably low. However, when a resistor with low impedance is used, a noise current caused by thermal noise increases and thus, reception sensitivity may deteriorate.

In contrast, according to the light reception circuit and the light reception device illustrated in FIG. 4, 5, or 6, since the impedance of the DC level shift circuit 6 is low, high speed processing may be achieved. Further, since the impedance between the cathode and the anode of the photodiode 1 is high and the coupling is performed without using a resistive load, occurrence of noise may be suppressed.

Another Example of Light Reception Circuit and Light Reception Device

Figure 7:
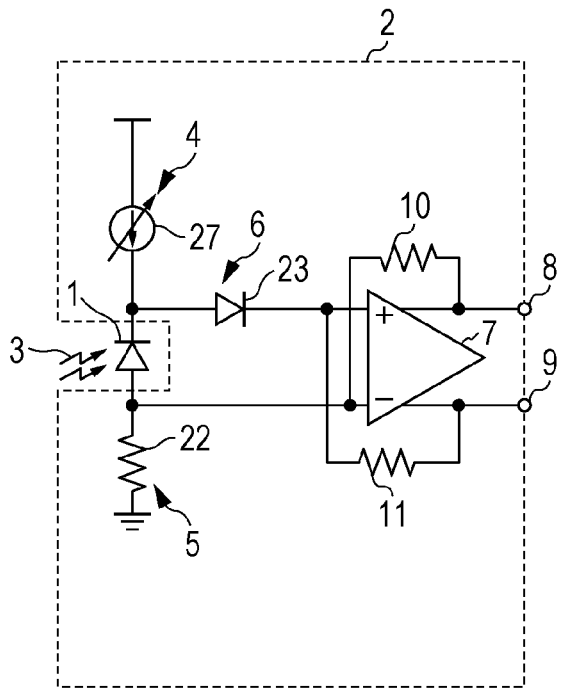
FIG. 7 illustrates another example #6 of the light reception circuit and the light reception device according to the embodiment.

FIG. 7 illustrates another example #6 of the light reception circuit and the light reception device according to the embodiment. The light reception circuit and light reception device illustrated in FIG. 7 includes an adjustment circuit that may adjust the amount of a current that flows in the DC level shift circuit 6. In the light reception circuit and the light reception device illustrated in FIG. 7, compared with the light reception circuit and the light reception device illustrated in FIG. 1, a variable current source 27 is used for the bias circuit 4 on the cathode side, the resistor 22 is used for the bias circuit 5 on the anode side, and the diode 23 is used for the DC level shift circuit 6. The variable current source 27 is an example of the adjustment circuit. With regard to constituents similar to the constituents of the light reception circuit and the light reception device illustrated in FIG. 1, repeated explanation is omitted.

The variable current source 27 used for the bias circuit 4 on the cathode side is coupled between the cathode of the photodiode 1 and the positive power supply line. The resistor 22 used for the bias circuit 5 on the anode side and the diode 23 used for the DC level shift circuit 6 are explained in the example illustrated in FIG. 4. Thus, repeated explanation is omitted. The variable current source 27 may be coupled to the ground line and the resistor 22 on the anode side may be coupled to the negative power supply line.

According to the light reception circuit and the light reception device illustrated in FIG. 7, the amount of a current that flows in the diode 23 used for the DC level shift circuit 6 may be adjusted by adjusting the variable current source 27. Thus, the shift amount of the DC voltage level caused by the DC level shift circuit 6 may be adjusted and a difference between the DC voltage level of the electric signal input to the positive input terminal of the differential amplifier 7 and the DC voltage level of the electric signal input to the negative input terminal of the differential amplifier 7 may be reduced.

Also, since the variable current source 27 may maintain the diode 23 used for the DC level shift circuit 6 in the state with a forward directional bias, the impedance of the DC level shift circuit 6 may be reduced. Thus, the light reception circuit 2 may be caused to operate at a higher speed. The amount of the current that flows in the DC level shift circuit 6 may be adjusted using a variable resistor instead of the variable current source 27.

Another Example of Light Reception Circuit and Light Reception Device

Figure 8:
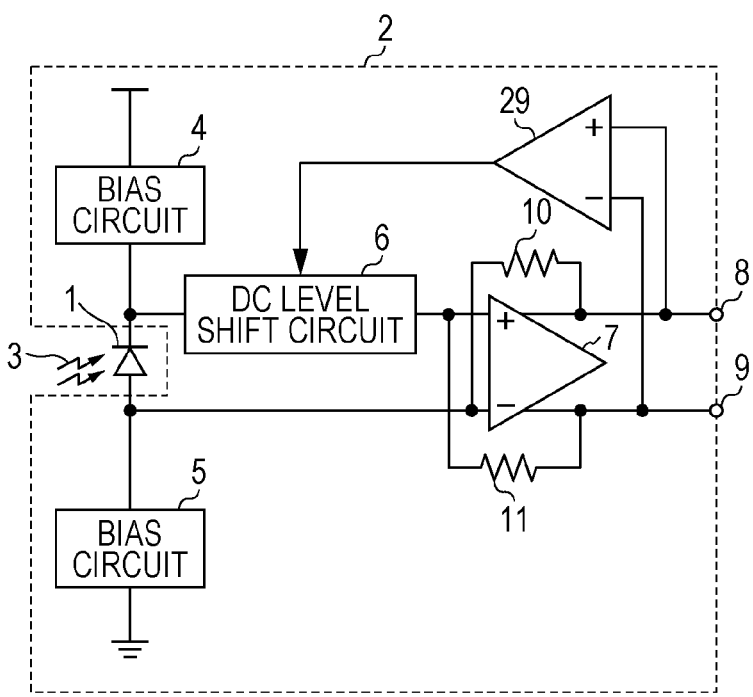
FIG. 8 illustrates another example #7 of the light reception circuit and the light reception device according to the embodiment.

FIG. 8 illustrates another example #7 of the light reception circuit and the light reception device according to the embodiment. In the light reception circuit and the light reception device illustrated in FIG. 8, compared with the light reception circuit and the light reception device illustrated in FIG. 1, the shift amount of the DC voltage level of the DC level shift circuit 6 is adjusted by a differential amplifier 29, which is different from the differential amplifier 7 that amplifies a difference between the electric signals output from the anode and the cathode of the photodiode 1.

A positive input terminal of the differential amplifier 29 that adjusts the DC level shift circuit 6 is coupled to the positive output terminal of the differential amplifier 7. A signal output from the positive output terminal of the differential amplifier 7 is input to the positive input terminal of the differential amplifier 29. A negative input terminal of the differential amplifier 29 that adjusts the DC level shift circuit 6 is coupled to the inverting output terminal of the differential amplifier 7. A signal output from the inverting output terminal of the differential amplifier 7 is input to the negative input terminal of the differential amplifier 29.

The differential amplifier 29 that adjusts the DC level shift circuit 6 determines a difference between the DC voltage level of the signal output from the positive output terminal of the differential amplifier 7 and the DC voltage level of the signal output from the inverting output terminal of the differential amplifier 7, and outputs a control signal that may make the difference zero. The DC level shift circuit 6 causes a current to flow based on the control signal output from the differential amplifier 29.

When the DC level shift circuit 12 is coupled to the anode of the photodiode 1 as illustrated in FIG. 2, the differential amplifier 29 may adjust the shift amount of the DC voltage level of the DC level shift circuit 12 coupled to the anode of the photodiode 1. When the DC level shift circuit 12 is also coupled to the anode of the photodiode 1 as illustrated in FIG. 3, the differential amplifier 29 may adjust the shift amounts of the DC voltage levels of the DC level shift circuits 6 and 12 coupled to the cathode and the anode of the photodiode 1.

Another Example of Light Reception Circuit and Light Reception Device

Figure 9:
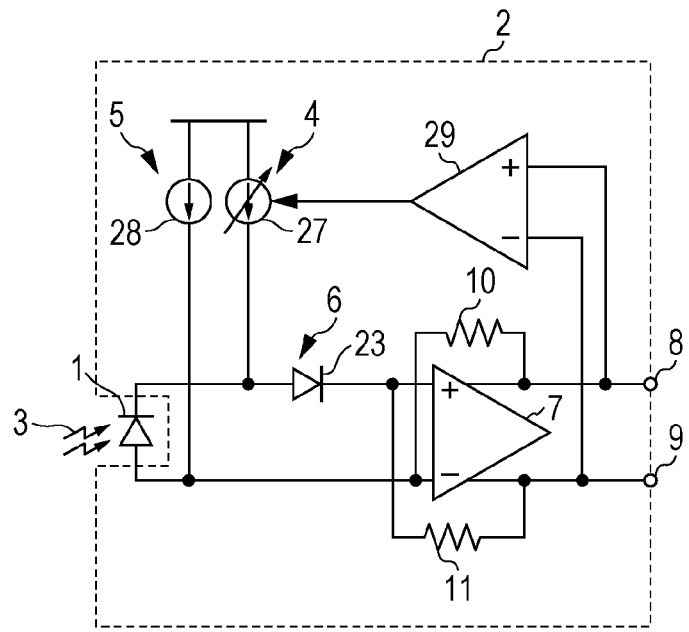
FIG. 9 illustrates another example #8 of the light reception circuit and the light reception device according to the embodiment.

FIG. 9 illustrates another example #8 of the light reception circuit and the light reception device according to the embodiment. The light reception circuit and the light reception device illustrated in FIG. 9 includes an adjustment circuit that may adjust the amount of the current that flows in the DC level shift circuit 6, and controls the adjustment circuit based on the difference in the DC voltage level of differential signals output from the differential amplifier 7.

In the light reception circuit and the light reception device illustrated in FIG. 9, compared with the light reception circuit and the light reception device illustrated in FIG. 8, the variable current source 27 is used for the bias circuit 4 on the cathode side, a current source 28 is used for the bias circuit 5 on the anode side, and the diode 23 is used for the DC level shift circuit 6. The variable current source 27 is an example of the adjustment circuit. The amount of the current that the variable current source 27 causes to flow is adjusted by the differential amplifier 29, which is different from the differential amplifier 7 that amplifies a difference between the electric signals output from the anode and the cathode of the photodiode 1.

The positive input terminal of the differential amplifier 29 that adjusts the variable current source 27 is coupled to the positive output terminal of the differential amplifier 7. A signal output from the positive output terminal of the differential amplifier 7 is input to the positive input terminal of the differential amplifier 29. The negative input terminal of the differential amplifier 29 that adjusts the variable current source 27 is coupled to the inverting output terminal of the differential amplifier 7. A signal output from the inverting output terminal of the differential amplifier 7 is input to the negative input terminal of the differential amplifier 29.

The differential amplifier 29 that adjusts the variable current source 27 determines a difference between the DC voltage level of the signal output from the positive output terminal of the differential amplifier 7 and the DC voltage level of the signal output from the inverting output terminal of the differential amplifier 7, and outputs a control signal that may make the difference zero. The variable current source 27 causes a current to flow based on the control signal output from the differential amplifier 29.

The current source 28 used for the bias circuit 5 on the anode side is coupled between the anode of the photodiode 1 and the positive power supply line. The variable current source 27 used for the bias circuit 4 on the cathode side is explained in the example illustrated in FIG. 7. The diode 23 used for the DC level shift circuit 6 is explained in the example illustrated in FIG. 4. Thus, repeated explanation is omitted. With regard to constituents similar to the constituents of the light reception circuit and the light reception device illustrated in FIG. 1, repeated explanation is omitted.

Although in the present example, the shift amount of the DC voltage level of the DC level shift circuit 6 is adjusted based on the current amount adjusted using the arrangement illustrated in FIG. 9, the arrangement is not limited hereto. When the arrangement enables the shift amount of the DC voltage level of the DC level shift circuit 6 to be adjusted and controlled so that the difference between the DC voltage level of the electric signal output from the positive output terminal of the differential amplifier 7 and the DC voltage level of the electric signal output from the inverting output terminal of the differential amplifier 7 may be reduced, another arrangement may be employed.

Another Example of Light Reception Circuit and Light Reception Device

Figure 10:
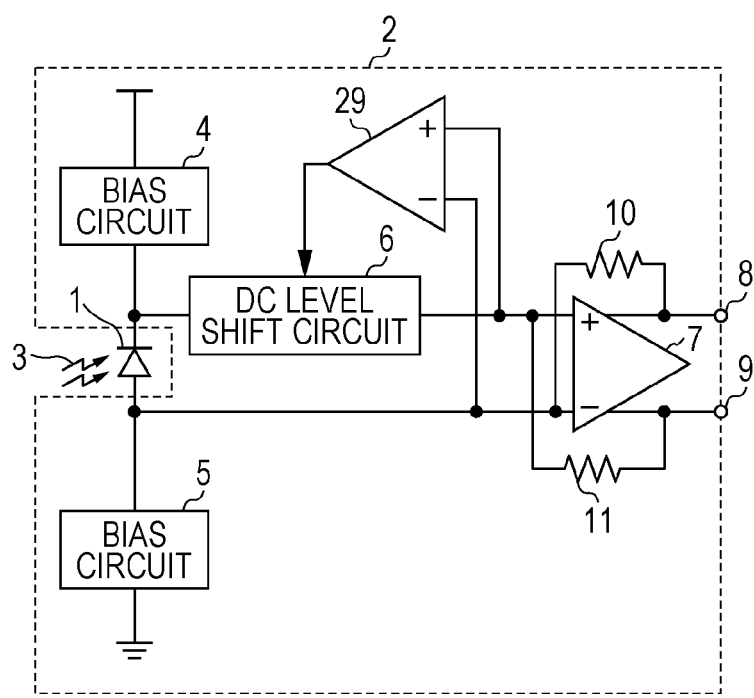
FIG. 10 illustrates another example #9 of the light reception circuit and the light reception device according to the embodiment.

FIG. 10 illustrates another example #9 of the light reception circuit and the light reception device according to the embodiment. In the light reception circuit and the light reception device illustrated in FIG. 10, compared with the light reception circuit and the light reception device illustrated in FIG. 1, the shift amount of the DC voltage level of the DC level shift circuit 6 is adjusted by the differential amplifier 29, which is different from the differential amplifier 7 that amplifies a difference between the electric signals output from the anode and the cathode of the photodiode 1.

The positive input terminal of the differential amplifier 29 that adjusts the DC level shift circuit 6 is coupled to the positive input terminal of the differential amplifier 7. A signal input to the positive input terminal of the differential amplifier 7 is input to the positive input terminal of the differential amplifier 29. The negative input terminal of the differential amplifier 29 that adjusts the DC level shift circuit 6 is coupled to the negative input terminal of the differential amplifier 7. A signal input to the negative input terminal of the differential amplifier 7 is input to the negative input terminal of the differential amplifier 29.

The differential amplifier 29 that adjusts the DC level shift circuit 6 determines a difference between the DC voltage level of the signal input to the positive input terminal of the differential amplifier 7 and the DC voltage level of the signal input to the negative input terminal of the differential amplifier 7, and outputs a control signal that may the difference zero. The DC level shift circuit 6 causes a current to flow based on the control signal output from the differential amplifier 29.

When the DC level shift circuit 12 is coupled to the anode of the photodiode 1 as illustrated in FIG. 2, the differential amplifier 29 may adjust the shift amount of the DC voltage level of the DC level shift circuit 12 coupled to the anode of the photodiode 1. When the DC level shift circuit 12 is also coupled to the anode of the photodiode 1 as illustrated in FIG. 3, the differential amplifier 29 may adjust the shift amounts of the DC voltage levels of the DC level shift circuits 6 and 12 coupled to the cathode and the anode of the photodiode 1.

Another Example of Light Reception Circuit and Light Reception Device

Figure 11:
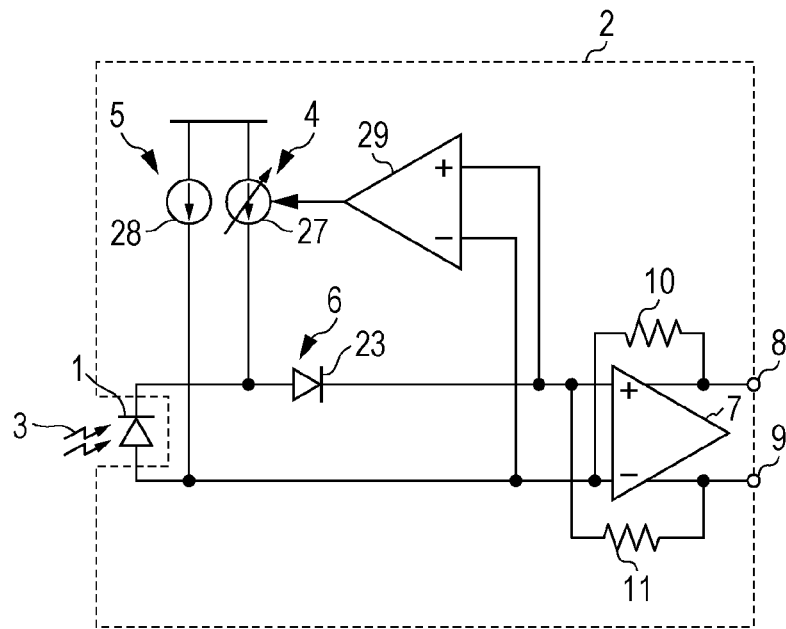
FIG. 11 illustrates another example #10 of the light reception circuit and the light reception device according to the embodiment.

FIG. 11 illustrates another example #10 of the light reception circuit and the light reception device according to the embodiment. The light reception circuit and the light reception device illustrated in FIG. 11 includes an adjustment circuit that may adjust the amount of the current that flows in the DC level shift circuit 6, and controls the adjustment circuit based on a difference in the DC voltage level between the differential signals input to the differential amplifier 7.

In the light reception circuit and the light reception device illustrated in FIG. 11, compared with the light reception circuit and the light reception device illustrated in FIG. 10, the variable current source 27 is used for the bias circuit 4 on the cathode side, the current source 28 is used for the bias circuit 5 on the anode side, and the diode 23 is used for the DC level shift circuit 6. The variable current source 27 is an example of the adjustment circuit. The amount of the current that the variable current source 27 causes to flow is adjusted by the differential amplifier 29, which is different from the differential amplifier 7 that amplifies a difference between the electric signals output from the anode and the cathode of the photodiode The positive input terminal of the differential amplifier 29 that adjusts the variable current source 27 is coupled to the positive input terminal of the differential amplifier 7. A signal input to the positive input terminal of the differential amplifier 7 is input to the positive input terminal of the differential amplifier 29. The negative input terminal of the differential amplifier 29 that adjusts the variable current source 27 is coupled to the negative input terminal of the differential amplifier 7. A signal input to the negative input terminal of the differential amplifier 7 is input to the negative input terminal of the differential amplifier 29.

The differential amplifier 29 that adjusts the variable current source 27 determines a difference between the DC voltage level of the signal input to the positive input terminal of the differential amplifier 7 and the DC voltage level of the signal input to the negative input terminal of the differential amplifier 7, and outputs a control signal that may make the difference zero. The variable current source 27 causes a current to flow based on the control signal output from the differential amplifier 29.

The current source 28 used for the bias circuit 5 on the anode side is explained in the example illustrated in FIG. 9. The variable current source 27 used for the bias circuit 4 on the cathode side is explained in the example illustrated in FIG. 7. The diode 23 used for the DC level shift circuit 6 is explained in the example illustrated in FIG. 4. Thus, repeated explanation is omitted. With regard to constituents similar to the constituents of the light reception circuit and the light reception device illustrated in FIG. 1, repeated explanation is omitted.

Although in the present example, the shift amount of the DC voltage level of the DC level shift circuit 6 is adjusted based on the current amount adjusted using the arrangement illustrated in FIG. 11, the arrangement is not limited hereto. When the arrangement enables the shift amount of the DC voltage level of the DC level shift circuit 6 to be adjusted and controlled so that a difference between the DC voltage level of the electric signal input to the positive input terminal of the differential amplifier 7 and the DC voltage level of the electric signal input to the negative input terminal of the differential amplifier 7 may be reduced, another arrangement may be employed.

According to the light reception circuit and the light reception device illustrated in FIGS. 8 to 11, the amount of the current that flows in the DC level shift circuit 6 is adjusted so that a difference in the DC voltage level between the differential signals output from the differential amplifier 7 or a difference in the DC voltage level between the differential signals input to the differential amplifier 7 may become zero. Thus, the shift amount of the DC voltage level caused by the DC level shift circuit 6 may be adjusted. As a result, a difference between the DC voltage level of the electric signal output from the anode of the photodiode 1 and the DC voltage level of the electric signal output from the cathode of the photodiode 1 may be compensated.

The difference between the DC voltage level of the electric signal output from the anode of the photodiode 1 and the DC voltage level of the electric signal output from the cathode of the photodiode 1 changes dependent on variations in light reception intensity of the photodiode 1. The amount of the change caused by the variations in the light reception intensity of the photodiode 1 may be compensated by adjusting the amount of the current that flows in the DC level shift circuit 6 so that the difference in the DC voltage level between the differential signals output from the differential amplifier 7 or the difference in the DC voltage level between the differential signals input to the differential amplifier 7 may become zero.

Comparison with Light Reception Device Using Capacitive Coupling Via Capacitor

Figure 12:
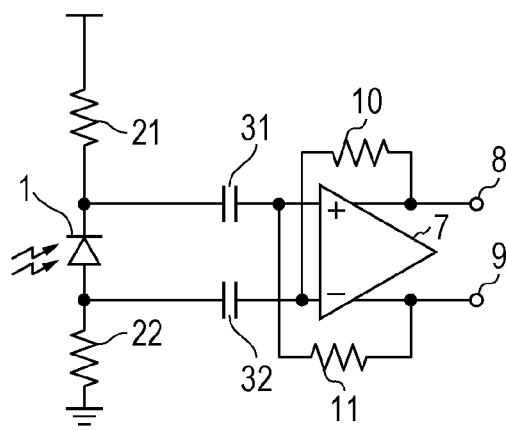
FIG. 12 illustrates an example of a light reception device using capacitive coupling.

FIG. 12 illustrates an example of a light reception device using capacitive coupling. In the light reception device illustrated in FIG. 12, compared with the light reception device illustrated in FIG. 4, the cathode of the photodiode 1 and the positive input terminal of the differential amplifier 7 are coupled by capacitive coupling via a capacitor 31, and the anode of the photodiode 1 and the negative input terminal of the differential amplifier 7 are coupled by capacitive coupling via a capacitor 32. The other constituents of the light reception device illustrated in FIG. 12 are similar to the constituents of the light reception device illustrated in FIG. 4.

FIGS. 13A to 13D illustrate simulation results of an input waveform and an output waveform of the light reception device illustrated in FIG. 4. FIGS. 14A to 14D illustrate simulation results of an input waveform and an output waveform of the light reception device illustrated in FIG. 12. In the light reception device illustrated in FIG. 12, the photodiode 1, the resistors 21 and 22 coupled to the cathode and the anode of the photodiode 1, respectively, the differential amplifier 7, and the resistors 10 and 11 coupled between the input terminal and the output terminal of the differential amplifier 7 have the same characteristics as the characteristics of the corresponding constituents of the light reception device illustrated in FIG. 4. Further, for example, a data rate is 16 Gb/s.

Figure 13A:
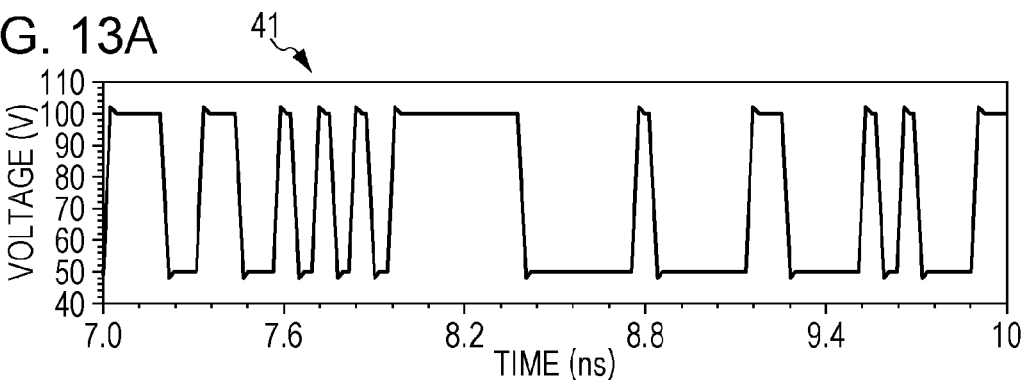
FIGS. 13A to 13D illustrate simulation results of an input waveform and an output waveform of the light reception device illustrated in FIG. 4.
Figure 13B:
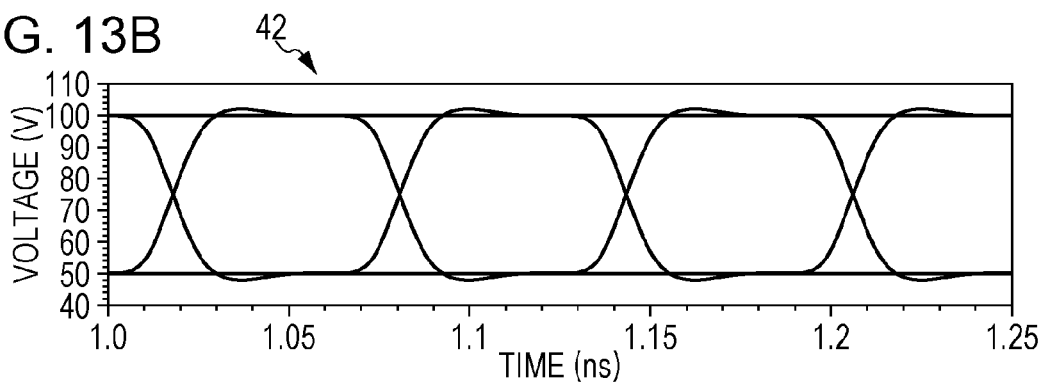
Figure 13C:
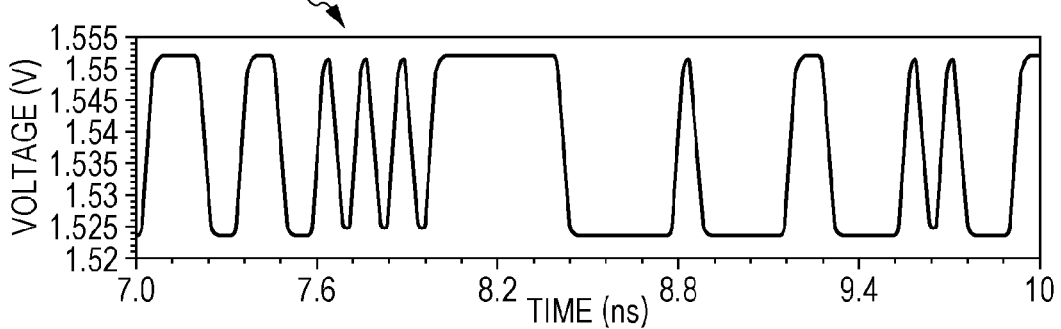
Figure 13D:
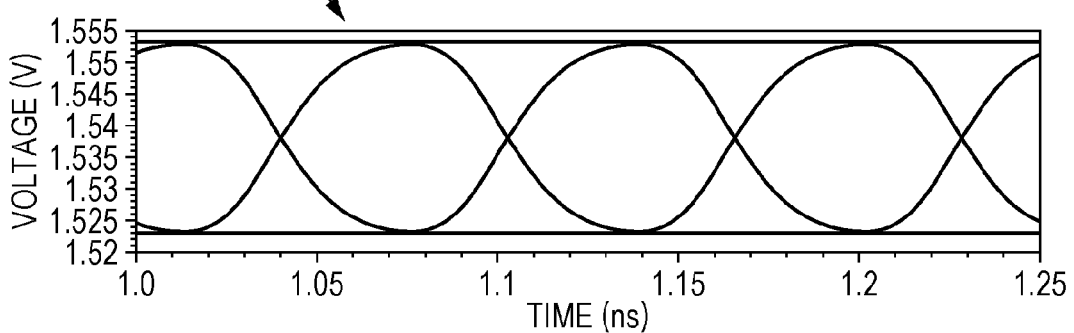
Figure 14A:
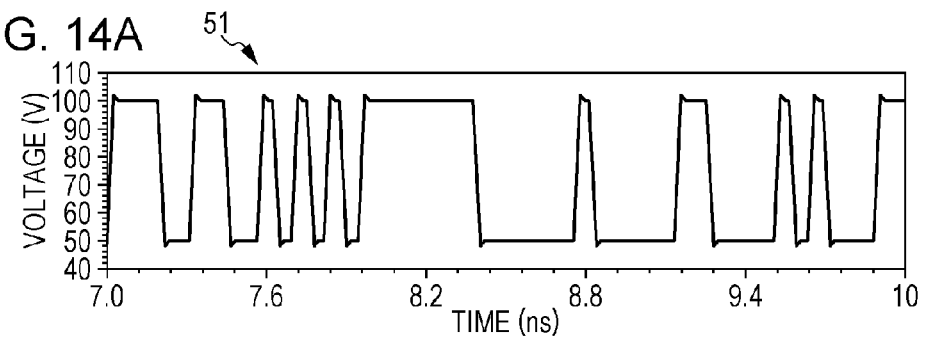
FIGS. 14A to 14D illustrate simulation results of an input waveform and an output waveform of the light reception device illustrated in FIG. 12.

FIG. 13A illustrates a time waveform 41, which is an input waveform, FIG. 13B illustrates an eye waveform 42, which is an input waveform, FIG. 13C illustrates a time waveform 43, which is an output waveform, and FIG. 13D illustrates an eye waveform 44, which is an output waveform. FIG. 14A illustrates a time waveform 51, which is an input waveform, FIG. 14B illustrates an eye waveform 52, which is an input waveform, FIG. 14C illustrates a time waveform 53, which is an output waveform, and FIG. 14D illustrates an eye waveform 54, which is an output waveform.

Figure 14B:
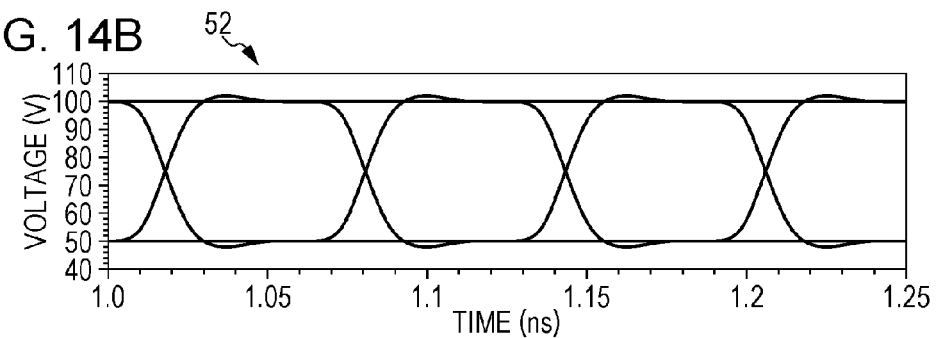
Figure 14C:
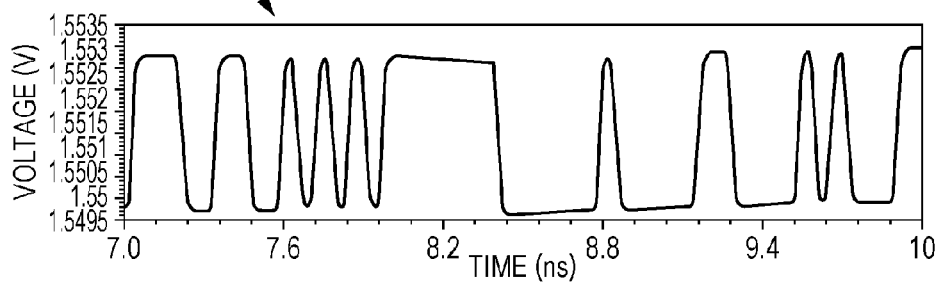
Figure 14D:
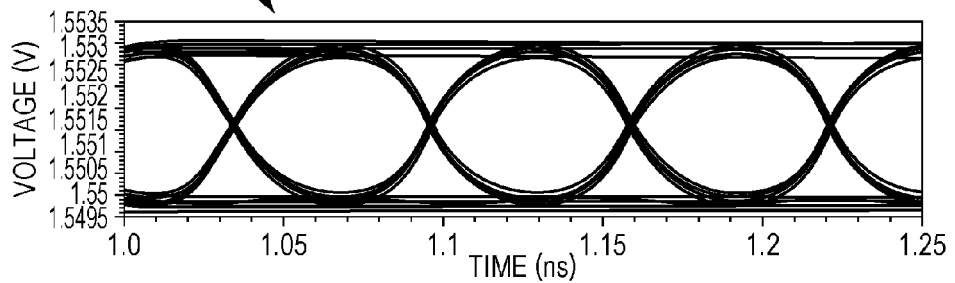

As indicated in FIGS. 13A and 13B by the time waveform 41 and the eye waveform 42, which are input waveforms, and indicated in FIGS. 14A and 14B by the time waveform 51 and the eye waveform 52, which are input waveforms, the input waveforms are the same. According to the time waveform 43 in FIG. 13C, which is an output waveform, no fluctuations are occurring in the waveform of the signal formed of "0" and "1", which are continuous values. Accordingly, the eye waveform 44, which is an output waveform, is favorable. In contrast, according to the time waveform 53 in FIG. 14C, which is an output waveform, fluctuations are occurring in the waveform of the signal formed of "0" and "1", which are continuous values, because of the low-frequency cutoff caused by the capacitive coupling. As a result, the eye waveform 54, which is an output waveform, deteriorates.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A light reception circuit, comprising:
a direct current (DC) level shift circuit that shifts a DC voltage level of a first electric signal and outputs a third electric signal, shifts a DC voltage level of a second electric signal and outputs a fourth electric signal, or outputs both of the third electric signal and the fourth electric signal so that a DC voltage level of the first electric signal output from a cathode of a photodiode that generates an electric signal by photoelectric conversion and a DC voltage level of the second electric signal output from an anode of the photodiode agree;
a differential amplifier that amplifies a difference between the third electric signal and the second electric signal when the DC level shift circuit outputs the third electric signal, amplifies a difference between the first electric signal and the fourth electric signal when the DC level shift circuit outputs the fourth electric signal, or amplifies a difference between the third electric signal and the fourth electric signal when the DC level shift circuit outputs both the third electric signal and the fourth electric signal; and
a bias circuit that applies an opposite directional bias between the anode of the photodiode and the cathode of the photodiode,
impedance of the DC level shift circuit being lower than input impedance of the differential amplifier.

2. The light reception circuit according to claim 1, wherein impedance between the anode of the photodiode and the cathode of the photodiode is high.

3. The light reception circuit according to claim 1, wherein the DC level shift circuit includes a diode and shifts the DC voltage level based on a voltage caused in the diode by a current that flows in the diode.

4. The light reception circuit according to claim 3, further comprising a current source that maintains the diode in the ON state.

5. The light reception circuit according to claim 1, wherein the bias circuit includes a resistor, a current source, or an inductor coupled to the anode of the photodiode, and includes a resistor, a current source, or an inductor coupled to the cathode of the photodiode.

6. The light reception circuit according to claim 1, further comprising an adjustment circuit capable of adjusting a shift amount of the DC voltage level of the DC level shift circuit, wherein the shift amount of the DC voltage level is adjusted by adjusting a control signal of the DC level shift circuit using the adjustment circuit.

7. The light reception circuit according to claim 1, further comprising an adjustment circuit capable of adjusting an amount of a current that flows in the DC level shift circuit, wherein a shift amount of the DC voltage level is adjusted by adjusting the amount of the current that flows in the DC level shift circuit using the adjustment circuit.

8. The light reception circuit according to claim 6, wherein the adjustment circuit adjusts the shift amount of the DC voltage level of the DC level shift circuit based on a difference in the DC voltage level between the third electric signal and the second electric signal when the DC level shift circuit outputs the third electric signal, based on a difference in the DC voltage level between the first electric signal and the fourth electric signal when the DC level shift circuit outputs the fourth electric signal, based on a difference in the DC voltage level between the third electric signal and the fourth electric signal when the DC level shift circuit outputs both the third electric signal and the fourth electric signal, or based on a differential signal output from the differential amplifier.

9. A light reception device, comprising:
a photodiode that generates an electric signal by photoelectric conversion;
a direct current (DC) level shift circuit that shifts a DC voltage level of a first electric signal and outputs a third electric signal, shifts a DC voltage level of a second electric signal and outputs a fourth electric signal, or outputs both of the third electric signal and the fourth electric signal so that a DC voltage level of the first electric signal output from a cathode of the photodiode and a DC voltage level of the second electric signal output from an anode of the photodiode agree;
a differential amplifier that amplifies a difference between the third electric signal and the second electric signal when the DC level shift circuit outputs the third electric signal, amplifies a difference between the first electric signal and the fourth electric signal when the DC level shift circuit outputs the fourth electric signal, or amplifies a difference between the third electric signal and the fourth electric signal when the DC level shift circuit outputs both the third electric signal and the fourth electric signal; and a bias circuit that applies an opposite directional bias between the anode of the photodiode and the cathode of the photodiode, impedance of the DC level shift circuit being lower than input impedance of the differential amplifier.

10. A light reception circuit, comprising:

a photodiode that generates a signal by photo conversion;

a direct current (DC) level shift circuit that shifts a DC voltage level of a first signal that is output from a cathode of the photodiode and/or a second signal that is output from an anode of the photodiode, and outputs a third signal and/or a fourth signal, so that a DC voltage level of the first signal and a DC voltage level of the second signal agree, a differential amplifier that amplifies a difference between the third signal and the second signal when the second signal is output from the photodiode and the third signal is output from the DC level shift circuit, amplifies a difference between the first signal and the fourth signal when the first signal is output from the photodiode and the fourth signal is output from the DC level shift circuit, or amplifies a difference between the third signal and the fourth signal when the third and fourth signals are output from the DC level shift circuit, based on the third signal when the third signal is output from the DC level shift circuit, or the fourth signal when the fourth signal is output from the DC level shift circuit, and a bias circuit that applies an opposite directional bias between the anode of the photodiode and the cathode of the photodiode;

an impedance of the DC level shift circuit being lower than an input impedance of the differential amplifier.

* * * * *